(12) United States Patent
Cheng et al.

(10) Patent No.: US 7,586,118 B2
(45) Date of Patent: Sep. 8, 2009

(54) MICRO DEVICE AND MANUFACTURING METHOD THEREOF

(75) Inventors: Kevin Cheng, Miaoli (TW); Chao-Feng Sung, Miaoli (TW); Yuh-Zheng Lee, Hsinchu (TW); Je-Ping Hu, Hsinchu (TW); Jane Chang, Hsinchu (TW); Jinn-Cherng Yang, Yilan (TW)

(73) Assignee: Industrial Technology Research Institute, Hsinchu (TW)

( * ) Notice: Subject to any disclaimer, the term of this patent is extended or adjusted under 35 U.S.C. 154(b) by 411 days.

(21) Appl. No.: 11/137,331

(22) Filed: May 26, 2005

(65) Prior Publication Data

US 2006/0118796 A1   Jun. 8, 2006

(30) Foreign Application Priority Data

Dec. 7, 2004   (TW) .............................. 93137761 A

(51) Int. Cl.
   *H01L 35/24*   (2006.01)
(52) U.S. Cl. ................. 257/40; 257/103; 257/E51.002; 438/42; 438/99
(58) Field of Classification Search .................... 257/40, 257/103, E51.002, E51.026; 438/42, 99
See application file for complete search history.

(56) References Cited

U.S. PATENT DOCUMENTS

| 4,005,440 | A | | 1/1977 | Amberntsson et al. |
| 5,250,319 | A | * | 10/1993 | Ohsako ..................... 427/96.8 |
| 6,774,392 | B2 | | 8/2004 | Humbs et al. |
| 2003/0193057 | A1 | | 10/2003 | Humbs et al. |
| 2004/0101987 | A1 | * | 5/2004 | Chabinyc et al. .............. 438/30 |
| 2004/0202819 | A1 | | 10/2004 | Frost et al. |
| 2007/0172979 | A1 | * | 7/2007 | Uchino et al. ................. 438/99 |

FOREIGN PATENT DOCUMENTS

CN   1550334 A   12/2004

* cited by examiner

*Primary Examiner*—Matthew E Warren
(74) *Attorney, Agent, or Firm*—Birch, Stewart, Kolasch & Birch, LLP

(57) ABSTRACT

A micro device and manufacturing method thereof. The micro device includes a substrate, an insulation layer, and a solution. The insulation layer is disposed on the substrate to define a channel portion and an extension portion communicated with the channel portion. The solution is location in the channel portion. Part of the solution flows to the extension portion by capillary force between the channel portion and the extension portion.

20 Claims, 4 Drawing Sheets

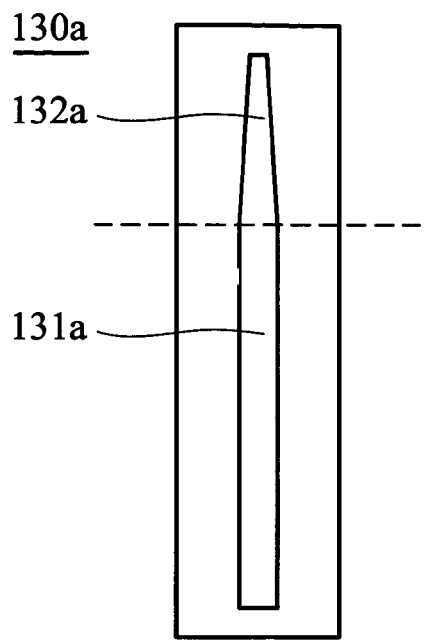
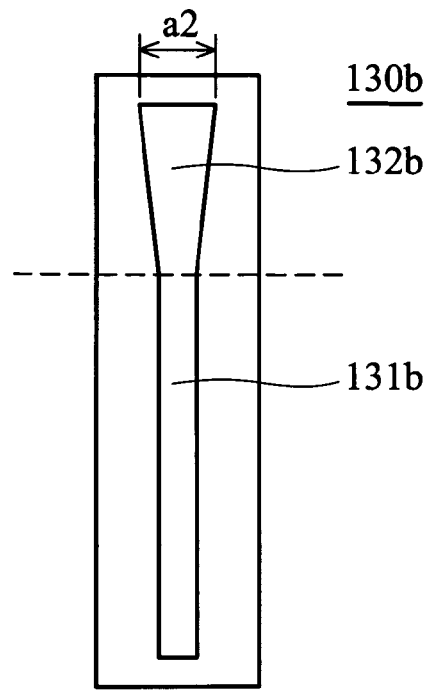
FIG. 3a          FIG. 3b
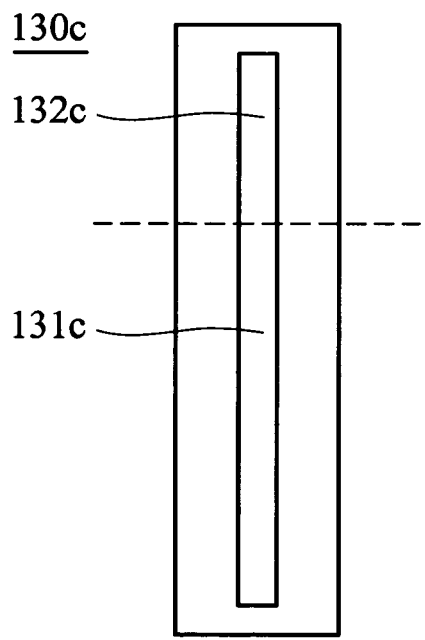
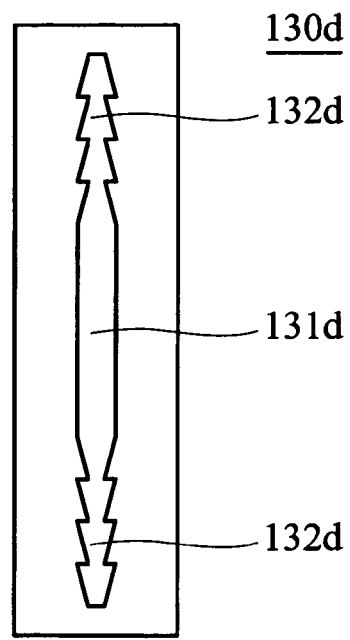
FIG. 3c          FIG. 3d

MICRO DEVICE AND MANUFACTURING METHOD THEREOF

BACKGROUND

The invention relates to micro devices, and in particular, for micro devices having a solution process that needs a uniform thickness therein due to capillary force.

Inkjet dispensing technique may be used to manufacture said micro devices, such as color filters, organic electroluminescent displays (OELD), micro lens, printed circuit board, and detection chips. During manufacture, a pattern with trench structure is pre-defined on a substrate to form a pixel element. The trenches are purposed to induce a uniform film generated on the substrate by ink-jet dispensing. Since ink-jet dispensing is unstable in the early stage and may deteriorate the substrate. Typically, the dispensing behavior becomes more stable after early stage, about several hundred drops ejected. Experience shows that the early-instable and following-stable behavior will cause the pressure difference which is generated due to capillary force along with the printing direction. It makes the thickness of the film may be non-uniform along the printing direction. Furthermore, if the trench is closed structure, the defect near ends of the pixel becomes serious since the pressure difference was balance by the close end, and form white omission at both ends of trench.

US Pat. No. 2003/0193057 discloses an organic light emitting diode and method for producing the same. Referring to FIGS. 1$a$-1$c$, to manufacture the organic light emitting diode, an electrode layer 2 is first formed on a substrate 1. A first insulation layer 3 and a second insulation layer 4 are then formed on the electrode layer 2. Finally, barriers 8 are formed at both ends 41 and 42 of a channel 40 formed by the second insulation layer 4. The thickness difference of organic polymer layers 5 and 6 filled in the channel 40 may be reduced by the barriers 8. Nevertheless, the insulation layers are formed by two steps, and the barriers are formed in the channel, thus complicating the process.

SUMMARY

An open trench structure of micro devices are provided. An exemplary embodiment of a micro device comprises a substrate, an insulation layer, and a solution. The insulation layer is processed on the substrate to define a channel portion and an extension portion communicated with the channel portion. The solution is located in the channel portion. Part of the solution flows to the extension portion by capillary force between the channel portion and the extension portion.

Furthermore, the channel portion comprises a uniform width (r). The extension portion is convergent with respect to the channel portion, and comprises a minimum width (a1), wherein $0<a1/r\leq1$. Alternatively, the extension portion may be divergent with respect to the channel portion, and comprises a maximum width (a2), wherein $1\leq a2/r<100$.

Moreover, the channel portion comprises a first end communicating with the extension portion, and a second end, opposite to the first end, communicating with the extension portion.

Additionally, the micro device further comprises an electrode layer located between the substrate and the insulation layer. The solution is located on the electrode layer. The electrode layer comprises indium tin oxide.

Note that the extension portion comprises a plurality of stepped portions. The substrate comprises can be glass or flexible substrate likes polyimide but not limited. Furthermore, the thickness of the channel portion can be fabricated in non-uniform structure along with trench to induce the flowing, and the cross section of the channel portion may be a quadrangle, a trapezoid, an inverted trapezoid, a parabola, a triangle, an inverted triangle, or a T-shape.

A method for manufacturing a micro device is also provided. An exemplary embodiment of a method for manufacturing a micro device comprises the following steps. A substrate and a solution-generating device are provided. A patterned insulation layer is formed on the substrate to define a channel portion and an extension portion communicated with the channel portion. A solution is provided in the channel portion via the solution-generating device, wherein part of the solution flows to the extension portion by capillary force between the channel portion and the extension portion.

Furthermore, the method comprises the following steps. Before the insulation layer is formed on the substrate, the substrate surface has been processed by plasma treatment or self-assembled monolayer treatment, and an electrode layer has formed on the substrate. After part of the solution was discharged and then flows to the extension portion from the channel portion, the solution is gradually drying in the channel portion and the extension portion, then elongates the film and smoothes the film surface.

Note that the solution-generating device may be an inkjet head or a dispensing machine. The solution comprises micro particles.

DESCRIPTION OF THE DRAWINGS

The invention can be more fully understood by reading the subsequent detailed description and examples with references made to the accompanying drawings, wherein:

FIG. 2$b$ is a schematic view of a channel portion and an extension portion; and FIGS. 3$a$-3$d$ are schematic views of embodiments of a channel portion and an extension portion.

DETAILED DESCRIPTION

Figure 1A:
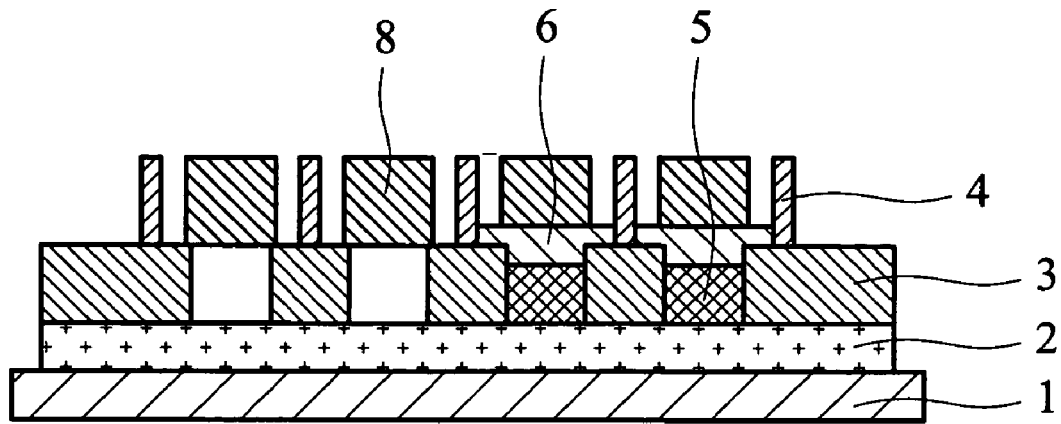
FIGS. 1$a$-1$c$ are schematic views of an organic light emitting diode disclosed in US Pat. No. 2003/0193057.
Figure 1B:
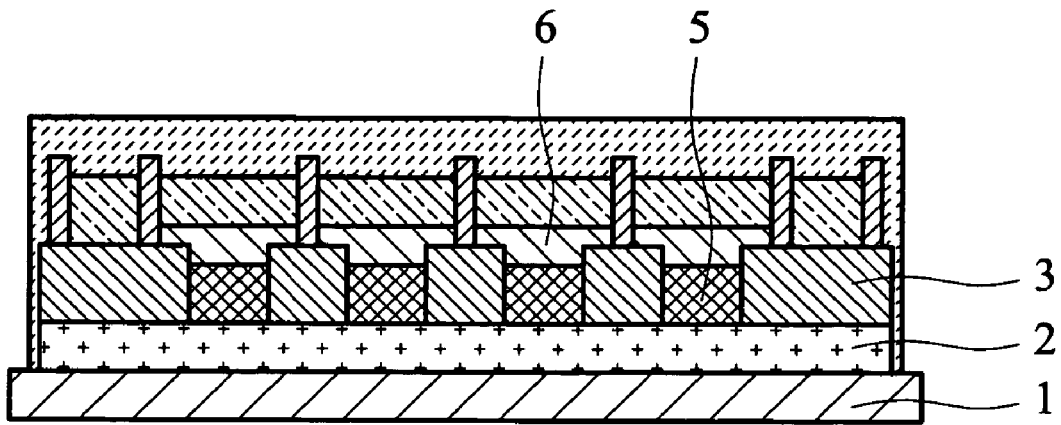
Figure 1C:
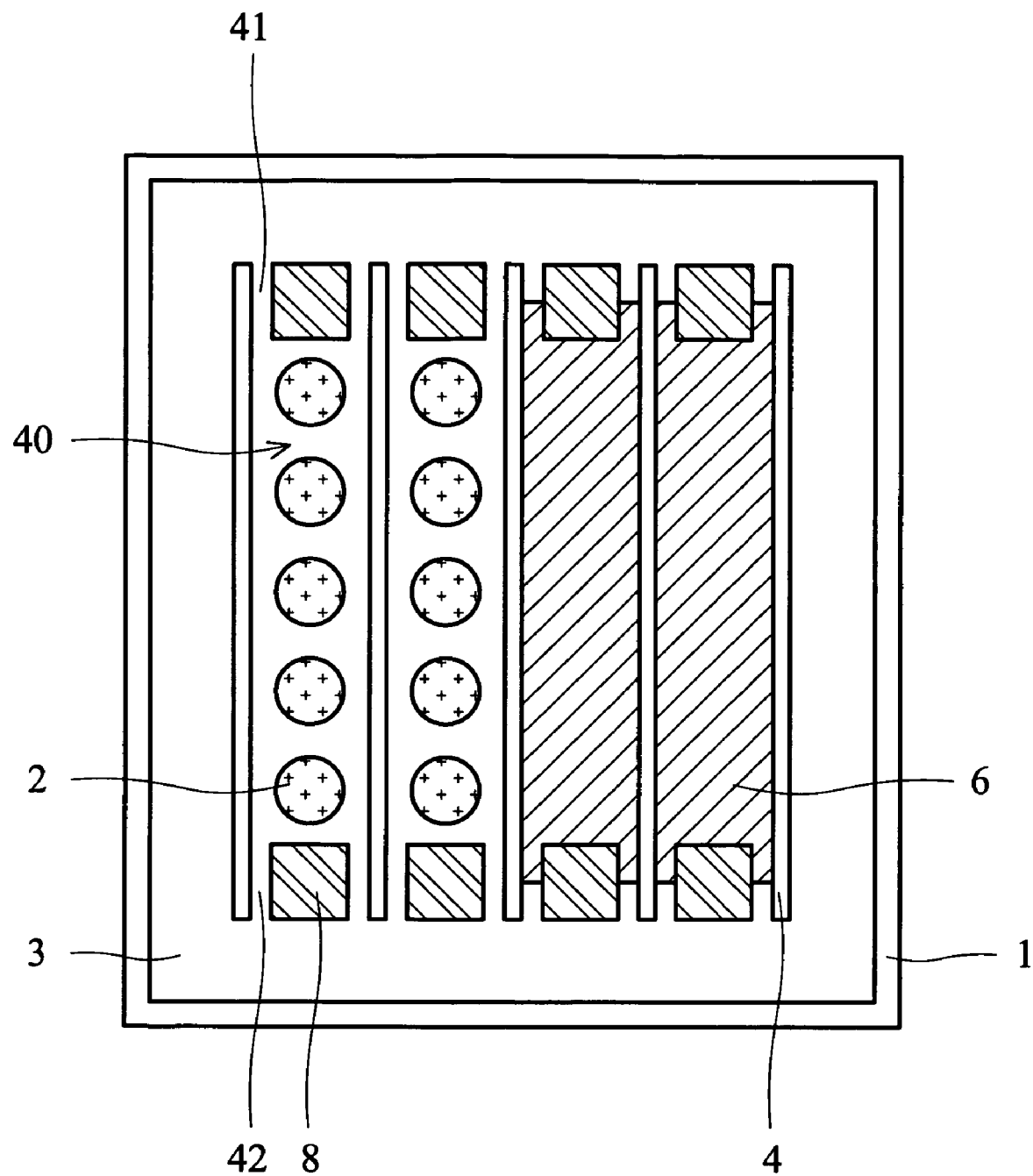

Referring to FIG. 2$a$, an embodiment of a micro device 100 comprises a substrate 110, an electrode layer 120, an insulation layer 130, and a solution 140. The substrate 110 may be made of glass or flexible substrate likes polyimide but not limited, and used as a base of the micro device 100.

The electrode layer 120 is disposed on the substrate 110 to be located between the substrate 110 and the insulation layer 130. The electrode layer 120 may be made of indium tin oxide, and used as an electrode of the micro device 100.

The insulation layer 130 is disposed on the electrode layer 120 of the substrate 100 to define a channel portion 131 and an extension portion 132. As shown in FIG. 2$b$, the solution 140 is received in the channel portion 131. The extension portion 132 communicates with the channel portion 131, and comprises a plurality of stepped portions 132'. By means of width differential between the channel portion 131 and the extension portion 132, part of the solution 140 in the channel portion 131 flows to the extension portion 132 by capillary force between the channel portion 131 and the extension portion 132. Thus, the thickness of the solution 140 in the channel portion 131 may be uniform, and defects may not be generated at ends of the channel portion 131.

Specifically, in FIG. 2$b$, the channel portion 131 comprises a uniform width (r). The extension portion 132 is convergent with respect to the channel portion 131, and comprises a minimum width (a1), wherein $0<a1/r<1$. A balance equation of the capillary theorem is $2\gamma_p/R_p = 2\gamma_d/R_d - 2\gamma_{pd}\cos(\theta_a)/r$. If $\theta_a$ and $\gamma$ are constant respectively, part of the solution 140 in the channel portion 131 may flow to the extension portion 132 by controlling the width of the channel portion 131 and the extension portion 132.

Figure 2A:
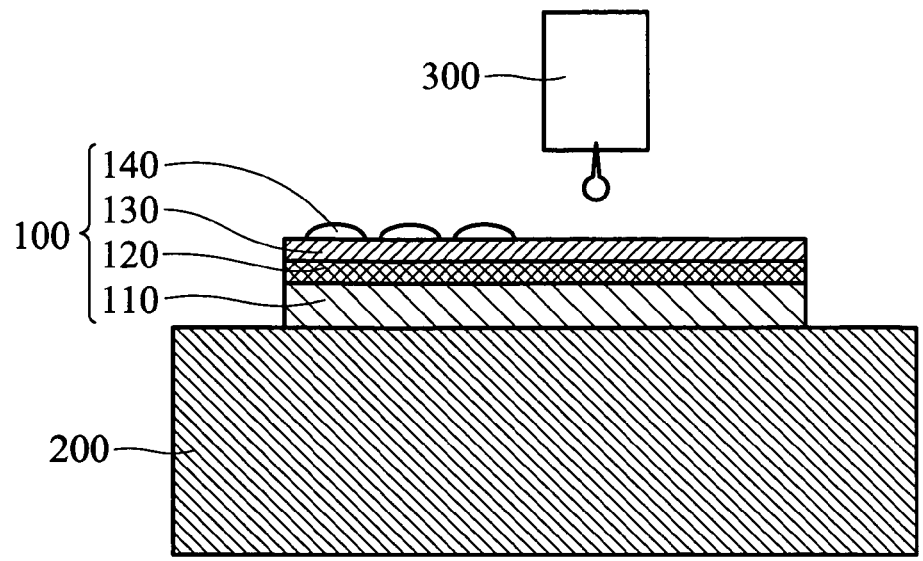
FIG. 2$a$ is a schematic view of an embodiment of a method for manufacturing a micro device.
Figure 2B:
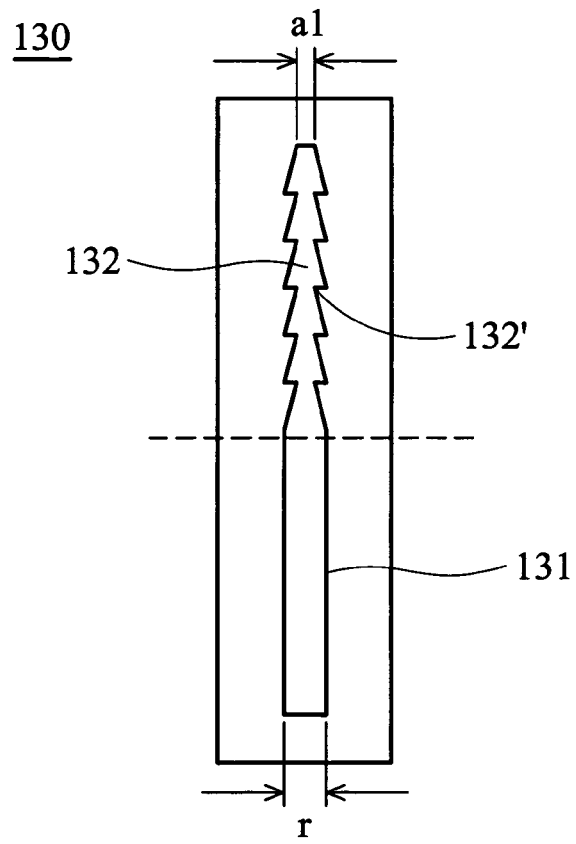

Additionally, in practice, the insulation layer 130 comprises a plurality of channel portions therein; however, only one channel portion is shown in FIG. 2b for simplicity.

Furthermore, note that the profile of the extension portion 132 is not limited to the profile shown in FIG. 2b. For example, another embodiment of an insulation layer 130a shown in FIG. 3a comprises an extension portion 132a without stepped portions. Another embodiment of an insulation layer 130b shown in FIG. 3b comprises a channel portion 131b and an extension portion 132b. The extension portion 132b is divergent with respect to the channel portion 131b, and comprises a maximum width (a2), wherein 1<a2/r<100. Another embodiment of an insulation layer 130c shown in FIG. 3c comprises a channel portion 131c and an extension portion 132c. The width of the extension portion 132c is the same as that of the channel portion 131c; that is, the ratio there between is one.

Moreover, while the extension portion 132 is simply communicated with one end of the channel portion 131 in FIG. 2b, it is not limited thereto. For example, another embodiment of an insulation layer 130d comprises a channel portion 131d and two extension portions 132d communicated with both ends of the channel portion 131d respectively.

A cross section profile of the channel portion may be a quadrangle, a trapezoid, an inverted trapezoid, a parabola, a triangle, an inverted triangle, or a T-shape. The thickness of the channel portion may be uniform, or may be fabricated in non-uniform structure along with trench to induce the flowing.

An embodiment of a method for manufacturing the micro device 100 comprises the following steps. Referring to FIG. 2a, a substrate 110 is placed on a base 200. The surface of the substrate 110 is processed by plasma treatment or self assembly monolayer treatment to obtain the required hydrophilic/hydrophobic property. Then, an electrode layer 120 is formed on the substrate 110. A patterned insulation layer 130 is formed on the electrode layer 120 to define a channel portion 131 and an extension portion 132. A solution 140 is provided in the channel portion 131 via a solution-generating device 132 to contact the electrode layer 120. Part of the solution 140 flows to the extension portion 132 by capillary force between the channel portion 131 and the extension portion 132. The solution 140 is dried in the channel portion 131 and the extension portion 132. The extension portion 132 is separated from the channel portion 131 to obtain a required micro device.

Note that the solution-generating device 300 may be an inkjet head or a dispensing machine. The solution 140 may comprise micro particles. Additionally, the surface treatment may only be performed on the area for forming the channel portion.

In summary, when the solution is located in the channel portion on the substrate, part of the solution may flow to the extension portion, thus balancing the pressure difference. After the solution is completely dried, a film with uniform thickness may be obtained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro device comprising:
    a substrate;
    an insulation layer disposed on the substrate to define a channel portion and an extension portion communicated with the channel portion, wherein the extension portion comprises a plurality of stepped portions; and
    a solution located in the channel portion, wherein part of the solution flows to the extension portion by capillary force between the channel portion and the extension portion.

2. The micro device as claimed in claim 1, wherein the channel portion comprises a uniform width (r), and the extension portion is convergent with respect to the channel portion.

3. The micro device as claimed in claim 2, wherein the extension portion comprises a minimum width (a1), and $0<a1/r\leq 1$.

4. The micro device as claimed in claim 1, wherein the channel portion comprises a first end communicating with the extension portion, and a second end, opposite to the first end, communicating with the extension portion.

5. The micro device as claimed in claim 1, further comprising an electrode layer located between the substrate and the insulation layer, wherein the solution is located on the electrode layer.

6. The micro device as claimed in claim 5, wherein the electrode layer comprises indium tin oxide.

7. The micro device as claimed in claim 1, wherein the substrate comprises glass.

8. The micro device as claimed in claim 1, wherein the thickness of the channel portion is non-uniform.

9. The micro device as claimed in claim 1, wherein a cross section of the channel portion is a quadrangle.

10. The micro device as claimed in claim 1, wherein a cross section of the channel portion is a trapezoid.

11. The micro device as claimed in claim 1, wherein a cross section of the channel portion is an inverted trapezoid.

12. The micro device as claimed in claim 1, wherein a cross section of the channel portion is a parabola.

13. The micro device as claimed in claim 1, wherein a cross section of the channel portion is a triangle.

14. The micro device as claimed in claim 1, wherein a cross section of the channel portion is an inverted triangle.

15. The micro device as claimed in claim 1, wherein a cross section of the channel portion is a T-shape.

16. The micro device as claimed in claim 1, wherein the plurality of stepped portions are arranged in series so that the solution from the channel portion flows to the extension portion in a predetermined direction.

17. The micro device as claimed in claim 16, wherein the plurality of stepped portions are formed in a sawtooth shape.

18. A micro device comprising:
    a substrate;
    an insulation layer disposed on the substrate to define a channel portion and an extension portion communicated with the channel portion, wherein the extension portion comprises a plurality of stepped portions, and the extension portion is divergent with respect to the channel portion; and
    a solution located in the channel portion, wherein part of the solution flows to the extension portion.

19. The micro device as claimed in claim 18, wherein the plurality of stepped portions are arranged in series.

20. The micro device as claimed in claim 18, wherein the channel portion comprises a uniform width (r), the extension portion comprises a maximum width (a2), and $1\leq a2/r<100$.

* * * * *